United States Patent [19]

Xiao et al.

[11] Patent Number: 6,100,714
[45] Date of Patent: Aug. 8, 2000

[54] HIGH DENSITY PLD STRUCTURE WITH FLEXIBLE LOGIC BUILT-IN BLOCKS

[75] Inventors: Ping Xiao, San Jose; YiYian P. Yin, Campbell, both of Calif.

[73] Assignee: ICT, Inc., San Jose, Calif.

[21] Appl. No.: 09/007,445

[22] Filed: Jan. 15, 1998

[51] Int. Cl.[7] ...................... H03K 19/177; H03K 19/173
[52] U.S. Cl. ................................ 326/39; 326/39; 326/41; 326/47
[58] Field of Search ................................. 326/37, 38, 39, 326/40, 41, 47

[56] References Cited

U.S. PATENT DOCUMENTS

| | | | |
|---|---|---|---|
| 4,124,899 | 11/1978 | Birkner et al. | 364/716 |
| 4,918,641 | 4/1990 | Jigour et al. | 364/716 |
| 5,046,035 | 9/1991 | Jigour et al. | 364/716 |
| 5,371,422 | 12/1994 | Patel et al. | 326/41 |
| 5,450,608 | 9/1995 | Steele | 326/39 |
| 5,473,266 | 12/1995 | Ahanin et al. | 326/41 |
| 5,475,321 | 12/1995 | Aoyama et al. | 326/39 |
| 5,483,178 | 1/1996 | Costello et al. | 326/41 |
| 5,631,576 | 5/1997 | Lee et al. | 326/39 |
| 5,799,176 | 8/1998 | Kapusta et al. | 326/39 |
| 5,809,281 | 9/1998 | Steele et al. | 326/39 |

*Primary Examiner*—Michael Tokar
*Assistant Examiner*—James H Cho
*Attorney, Agent, or Firm*—Townsend and Townsend and Crew LLP; Henry K. Woodward

[57] ABSTRACT

A programmable logic device (PLD) includes logic built-in blocks (LBB) connected with a programmable interconnection array (PIA). Each LBB has two configurable logic cells sharing a group of control product terms, which serve as global and local control signals. Each configurable logic cell employs a programmable array (an AND gate array connected to two OR gate arrays), followed by two groups of Multi-Register Macro Cells (MRMC). The multi-register macro cells contain registers, which are grouped into logic control cells, multiplexers and I/O cells. The registers receive sum terms from the OR gate arrays as inputs, while the multiplexers direct the flow of the outputs and feedbacks, which can be either latched outputs from registers or direct sum terms from the OR gate arrays. All of the controls of the multi-register macro cells in an LBB are available from shared control product terms, thus providing both local and global control signals. This PLD architecture achieves high density, high performance and great flexibility, while using less memory than current PLDs.

11 Claims, 6 Drawing Sheets

HIGH DENSITY PLD STRUCTURE WITH FLEXIBLE LOGIC BUILT-IN BLOCKS

BACKGROUND OF THE INVENTION

This invention relates to a programmable logic device (PLD) integrated circuit, and more particularly, the invention relates to a high density PLD with great flexibility and high performance using less memory than current PLDs.

The conventional way of constructing a PLD is to employ an AND gate array connected to an OR gate array, with inputs to the AND array. Both AND OR arrays are programmable, in order to provide a desired logical output from the OR array.

The outputs from OR gates can be connected to a functionally configurable macrocell, whereby the OR outputs can be latched, fed back to the AND array, or connected to I/O pins. The OR outputs can also be utilized as inputs to the AND array. The flexibility and capability of the macro cell can be increased by introducing into the cell configurable output-enables, configurable multiple selectors, configurable register clocks, register set and register reset signals.

The recent rapid development of semiconductor technology has made possible the design and manufacture of very complex integrated circuits. As a result, high density PLDs with very high flexibility and performance are commercially available. In these PLDs, in order to maintain high capability, it is more effective to divide AND OR arrays into small logic blocks, and connect them with a global connection facility. Because of the relatively small size of arrays, earlier high density PLDs had only one register permanently connected to every I/O pin. As the scale of arrays increased, the number of I/O pins was limited by package size and could not be increased accordingly. The logic capacity of PLDs was thus limited. Consequently, it is desirable to increase the number of registers with the concomitant increase of array scale, i.e., to increase the registers per I/O pin. This requires circuits that are used to manage the outputs and feedback of increased registers.

The performance of the high density device depends heavily on how the logic blocks are constructed and how they are connected together. Most of today's high density PLD products are constructed of logic blocks and a global interconnection, with all the logic blocks being connected together by the global interconnection, thus allowing information to be communicated between logic blocks. All the outputs from the logic block are fed into the global interconnection and all the inputs to the logic block come from the global interconnection. With more than one register per I/O pin, these PLDs use I/O control block to handle the outputs, where outputs are multipexed. This structure offers very high logic capability and is able to perform complex logic functions. However, three problems emerge with the structure. First with the number of registers per I/O pin increasing, a very complex I/O control block will result in more chip array area being used and low output performance. The global interconnection becomes the bottleneck of device performance with all the feedbacks from the logic blocks inputting into it and all the inputs of logic blocks outputting from it, without any local feedback within logic blocks. Lastly, the controls of the macro cell are fed into the cells in the same way as other logic signals, which also negatively affects the performance of the control signals.

SUMMARY OF THE INVENTION

An object of the invention is a high density PLD having high performance and high flexibility while using less memory array.

Another object of the invention is a facility to effectively manage the outputs and feedbacks within a logic built-in block (LBB).

Yet another object of the invention is a dedicated control structure serving as both global and local control within a logic built-in block (LBB).

Briefly, an internal-oriented logic built-in block is constructed to build a high density PLD with high capacity and less chip area. The logic built-in blocks are connected via a global programmable interconnection array. To minimize the global connections, the logic built-in block is designed so that only some of the outputs from the multi-register macro cell are fed back to the PIA. However, to enhance the performance of the LBB, all the local outputs are locally fed back to a local AND array. Outputs of a multiple-register macro cell in the LBB are simply selected through a multiplexer, while allowing other non-selected registers to be buried registers, which function independently with selected outputs. This greatly increases the logic capability of the multi-register macro cell. To facilitate the control of multi-register macro cells, a special control AND array is used to generate the local and global control signals of macro cells within an LBB.

A feature of the invention is a high density PLD based on the LBB which comprises of AND-OR arrays and multi-register macro cells. This LBB construction provides high performance and great flexibility.

Another feature of the invention is that all outputs within an LBB are fed back to a local AND array, which enhances the local logic implementation capability.

Yet another feature of the invention is that the feedbacks to the PIA are configurable, which minimizes the load on the global interconnection.

Still another feature of the invention is that a dedicated control AND array is designed within an LBB to provide more flexible macro cell control.

The invention and objects and feature thereof will be more readily apparent from the following description and appended claims when taken with the drawings.

DESCRIPTION OF THE PREFERRED EMBODIMENT

Figure 1:
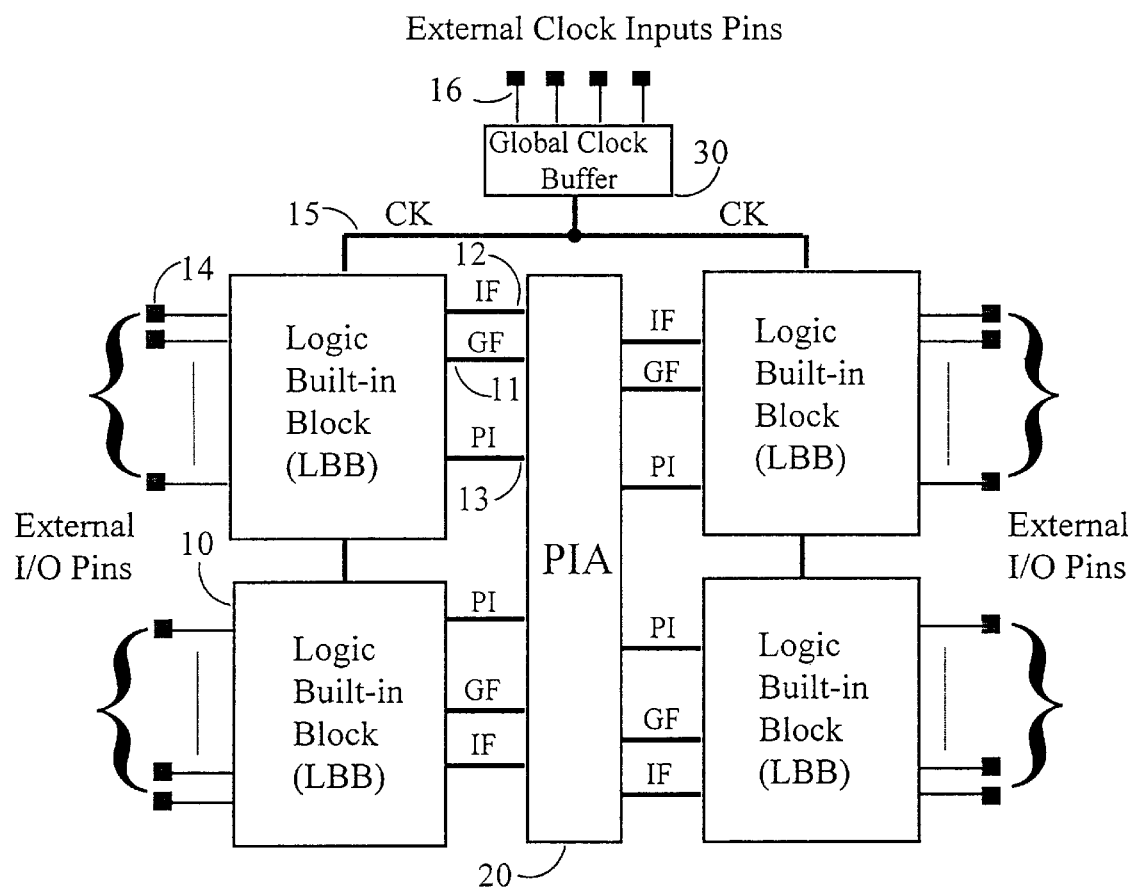
FIG. 1 is a block diagram of a high density programmable logic device in accordance with one embodiment of the invention.

A preferred embodiment of the invention is a high density programmable logic device (PLD) CMOS programmable electrically-erasable logic device, which can be programmed by a logic designer to perform various kinds of logic functions. It includes interspersed pockets of function and interconnect. A user's logic function is programmed into the device, which is preferably based on electrically erasable programmable read only memory (EEPROM) cells. Other kinds of programmable cells, such as static random access memory (SRAM) cells or programmable fuse/anti-fuse cells, may also be used as well. FIG. 1 is a block diagram of a PLD which shows its architecture in accordance with this embodiment of the invention. The device is constructed by connecting Logic Built-in Blocks (LBBs) 10 with a global Programmable Interconnection Array (PIA) 20. The device also employs a global clock buffer 30 to accept external clock inputs 16 and to generate a group of buffered global clocks 15 for synchronization purposes.

The logic built-in block 10 is a basic, but flexible functional element of this device. The LBB contains a large number of internal connections in order to perform logic functions relatively independently, while fewer signals are sent to the programmable interconnection array 20 for the exchange of information with other logic built-in blocks. Logic built-in blocks receive external input from external I/O pins 14 and PIA input 13 from the programmable interconnection array which conveys information from other LBBs. At the same time, to ensure that all the I/Os can feed inputs to every block of the device, logic built-in blocks feed all the Input/Feedback (IF) 12 into the global programmable interconnection array. To minimize the load on the interconnection array, instead of feeding all the outputs of an LBB into the PIA, only some of them are sent to the programmable interconnection array as Global Feedback (GF) 11.

There are two levels of interconnection in the device: local interconnection, which is inside the logic build-in block, and global interconnection, which is provided by the programmable interconnection array. The programmable interconnection array is a large array of switch matrices and is large enough to accommodate all of the LBB's global connections. It serves as a bridge to communicate logic information between LBBs, and enables multiple logic built-in blocks to work together to implement a more complex logic function. Through global feedback 11, the logic signal generated by one logic built-in block may be sent to the interconnection array, then switched to other logic built-in blocks through the PIA input 13, to perform more complex logic functions. The PIA also accommodates I/O pin inputs. The input/feedback 12 to the PIA utilizes the PIA as an input signal distributor to transfer external input signals to the LBB as appropriate.

The device provides four external dedicated clock pins 16 connected to the global clock buffer 30. The buffered clocks are connected to all the multi-register macro cells, in which the clock distribution circuit combines them with other LBB-wide or local clocks, and offers a versatile clocking scheme for the registers. By this mechanism, synchronous clocking, asynchronous clocking and multi-clocking can be easily achieved through configuration according to the application.

The PIA could be implemented in different ways. In the present embodiment an AND array is used to perform the interconnection. In addition to the interconnection, the array also provides an AND logic function. This kind of global interconnection increases the time taken to transfer signals, because all the gates of one column or row of EEPROM cells in the AND array are connected together, which results in a large capacitive load. The speed of an implemented system depends strongly on how often the signals connecting the logic blocks in the LBB cross the PIA. The logic functions within LBB are quite fast, however when a function involves global connection, increasing global interconnections reduce speed of the system. One of purposes of this invention is to enhance the local feedback to provide faster logic function.

One major object, and a feature of the invention is a high capacity and more flexible logic block which can be used easily to construct a high density PLD in different scales and different capacities. In FIG. 1, a high density PLD with four LBBs is depicted. This is only a exemplar of the invention. Those who are skilled in art may easily double or triple the number of LBBs to achieve more complex logic function. In such a situation, more interconnections in the PIA are needed to convey signals between added LBBs.

Figure 2:
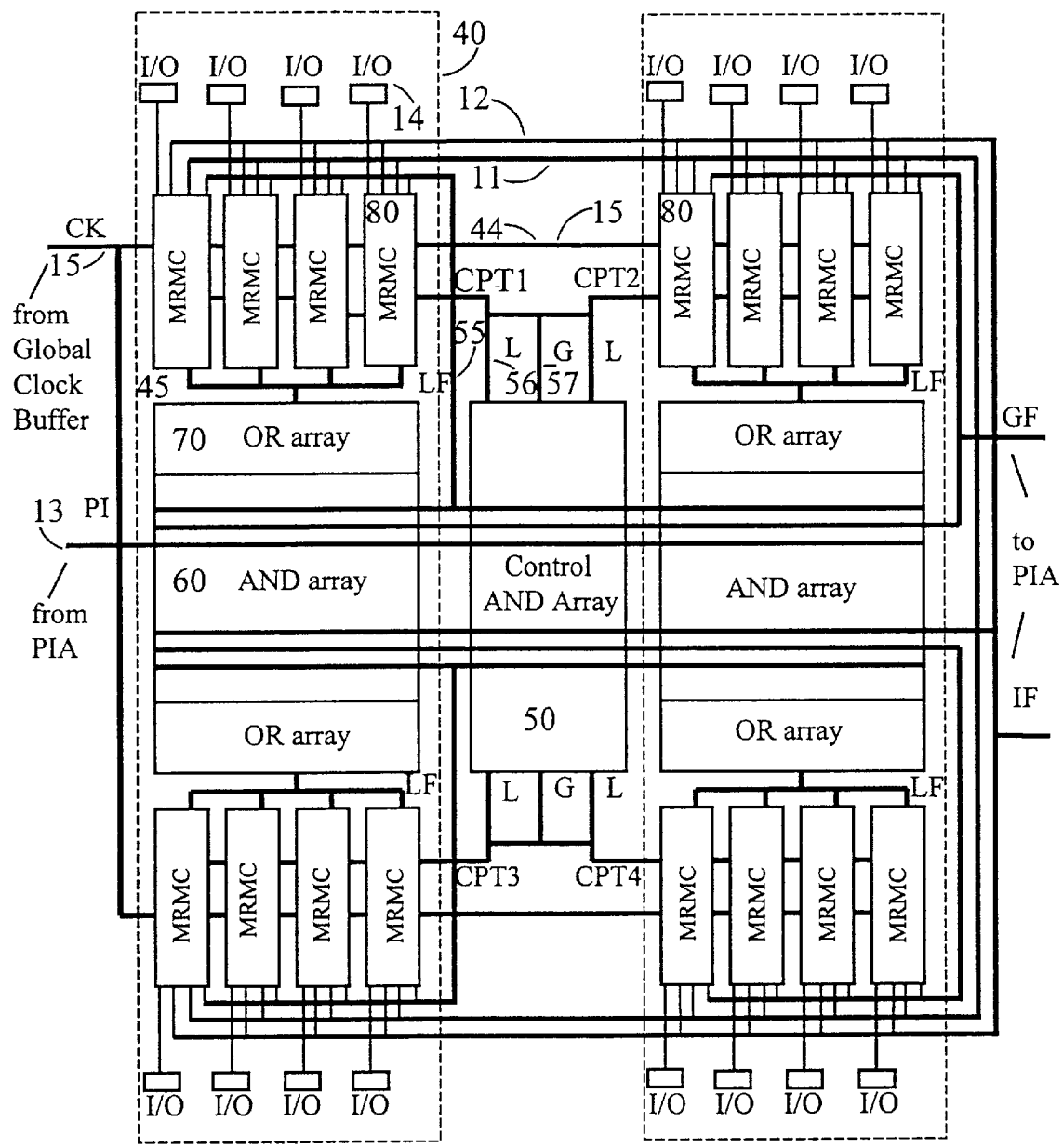
FIG. 2 is a block diagram of a logic built-in block (LBB) shown in FIG. 1, which includes two Configurable Logic Cells (CLCs) sharing a Control AND array.

FIG. 2 is a functional block diagram of the LBB in FIG. 1, which shows its major components and how they are assembled to form a desired logic function block. This LBB structure embodies features of the invention.

The LBB is generally constructed using two Configurable Logic Cells (CLCs) 40 sharing a dedicated control AND array 50. Each configurable logic cell contains a logic programmable AND-OR array (60, 70) followed by two groups of Multi-Register Macro Cells (MRMCs) 80 with each group having four multi-register macro cells.

The logic programmable AND-OR array is logically an AND gate array connected to an OR gate array, with inputs to the AND array being programmable to provide a desired logic output from the OR array. For logical convenience, a programmable AN-OR array is implemented by connecting one NAND array to another NAND array or connecting one NOR array to another NOR array. In this kind of array, the propagation delay is fixed, and independent of logic inputs. The fixed delay is determined by the total parasitic capacitance of the gates in a column or row. Therefore, the scale of the array and the design of the sense amplifier, which reads the logic value stored in the cells, will affect greatly the speed of the device. A typical example can be found in U.S. Pat. No. 4,124,899.

The Multi-register macro cell 80 is another novel structure of this invention. The cell contains a variable number of registers according to the logic capability requirement of the device. Its detailed structural explanation is given below.

From an overall point, the LBB consists of two AND-OR arrays (60, 70) connecting four groups of multi-register macro cells 80 sharing a dedicated control AND array, which serves as a universal control resource for the multi-register macro cells. Though the AND-OR arrays (60, 70) are physically separated in the LBB, they are logically connected as a whole, i.e., they have same inputs. The four groups of multi-register macro cells 80 have equal functionality, except that the local control signals from the control AND array 50 are different in each group.

The plenitude of connections in the LBB demonstrates the features of the invention. Every multi-register macro cell 80 has an external I/O pin 14. The I/O pins can be utilized as inputs to the AND array. The OR array 70 in every AND-OR (60, 70) array is physically separated into two sub-OR arrays 70 and then every group of multi-register macro cell has its own corresponding OR array. A total of twenty four sum terms from the OR array in each configurable logic cell 70 is sent into the multi-register macro cell 80. There is a total of eight multi-register macro cells for each configurable logic cell, so each multi-register macro cell has three sum terms, one for every register. The multi-register macro cells use a device wide global clock signal 15 from the global clock buffer to achieve synchronization of the logic signals. The control product terms 55 from the control AND array are sent into the multi-register macro cells 80 for control purposes. Each group of multi-register macro cells 80 outputs three groups of signals. They are input feedback 12, global feedback 11 and local feedback 44. Input feedback 12 is either an input signal from an external I/O pin, when the I/O is configured to an input buffer, or an output feedback when the I/O is configured to an output buffer. Global feedback 11 is a selected part of local feedback 44. The AND array 60 may accept two types of input, PIA input 13 and local feedback 44.

The PIA input 13 to the multi-register macro cell 80 is the input signal from the PIA which conveys the information from other LBBs. Local feedbacks 44 include all the output signals from the multi-register macro cells. By this mean, the local feedback is enhanced and a complex logic function can be implemented locally. With global feedback 11 feeding into the interconnection array, the logic built-in blocks can work together through a minimized global connection to implement a more complex logic design. With global feedback feeding into the interconnection array, input or output at the I/O pin can be globally sent to any other logic built-in block, through the programmable interconnection array. Thus, external inputs become global and, in some cases, complementary to global feedback.

The control AND array 50 is also a novel structure of this invention. The purpose of the control AND array is to provide a universal control mechanism for the multi-register macro cells. The control AND array inputs are the same as those of the other AND arrays. The control signals can be an AND Boolean logic of any combination of local feedback 44, input/feedback 12, and signals from the PIA input 13. The control AND array generates two types of control signal, local control signals 56 and logic built-in block-wide control signals 57. Logic built-in block-wide control signals are global within the logic built-in block, i.e. every multi-register macro cell has the same logic built-in block-wide control signals. Every group of multi-register macro cells has a different group of local control signals 56. Combined with the global clock 15 from the global clock buffer, any multi-register macro cell can be controlled to work in a different scope of synchronization, according to the logic design application. This configuration is also a means of enhancing the logic capability of the device.

Figure 3:
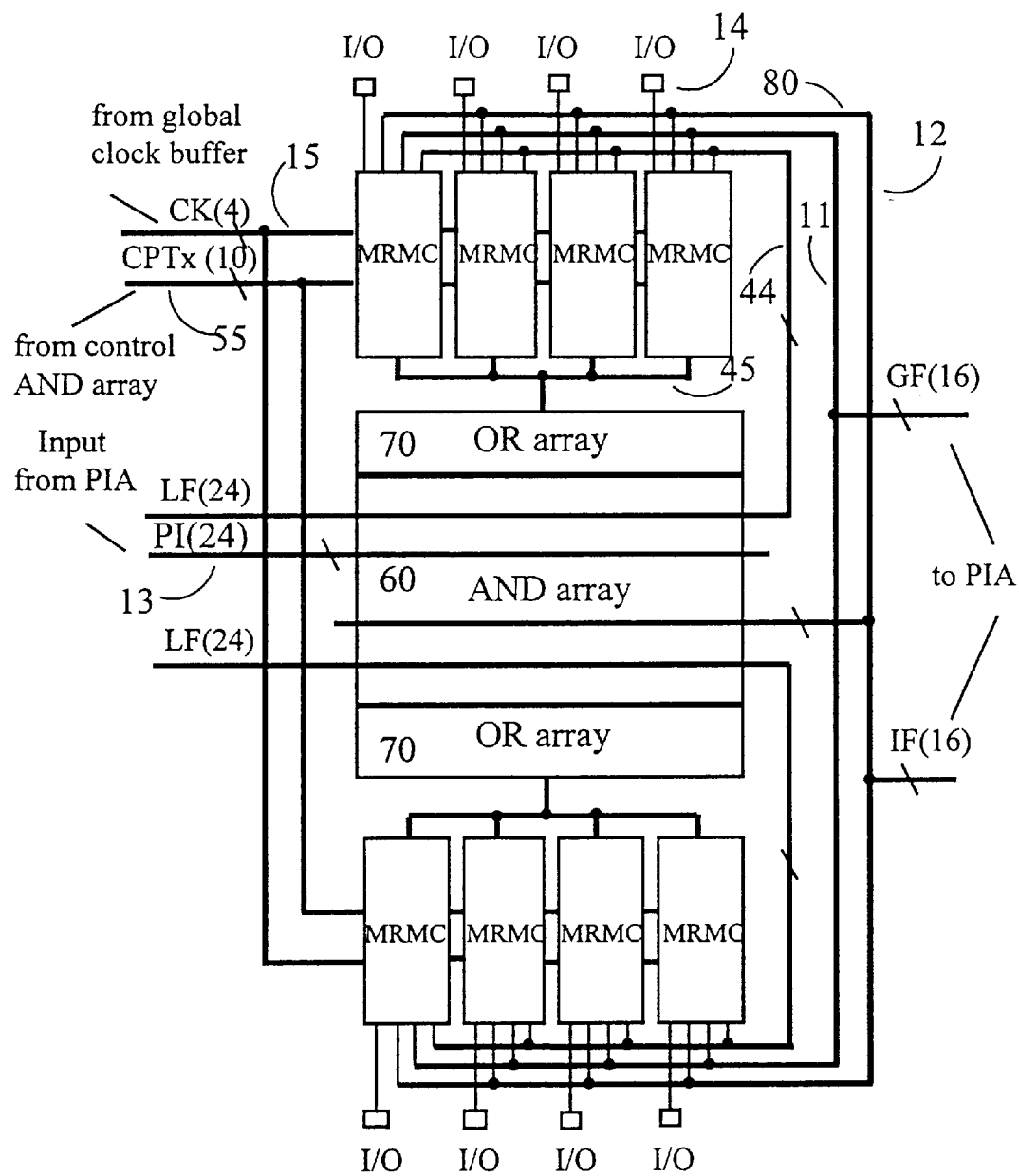
FIG. 3 is a block diagram of a Configurable Logic Cell (CLC) as an independent construction element, with emphasis on accurate signal allocation, in accordance with an embodiment of the invention.

FIG. 3 is a more detailed block diagram of a configurable logic cell as an independent construction element, with emphasis on accurate signal allocation, in accordance with an embodiment of the invention. There is a total of 88 inputs connected to the AND array, which generates 32 product terms (not shown in the figure). Inputs to the AND array include 24 local feedbacks 44 and their complements (totally 48), 12 inputs 13 from the PIA and their complements (totally 24), and 8 input/feedbacks 12 from the I/O cell and their complements (totally 16). The OR array accepts product terms from the AND array, and each sub-OR array generates 12 sum terms 45, which go to the multi-register macro cells 80. Each multi-register macro cell receives three sum terms (one for every register). Four external global clocks 15 from the global clock buffer are fed into every multi-register macro cell for the purpose of synchronization. There are a total of 24 local feedbacks 44 (one for every register) and their complements fed into the local AND array, and only 8 global feedbacks 12 (one for every multi-register macro cell) and their complements are fed to the PIA for global connection purposes. Besides being put into the AND array, 8 input/feedbacks 12 and their complements are also connected to the PIA for enhancement of global feedback.

Figure 4:
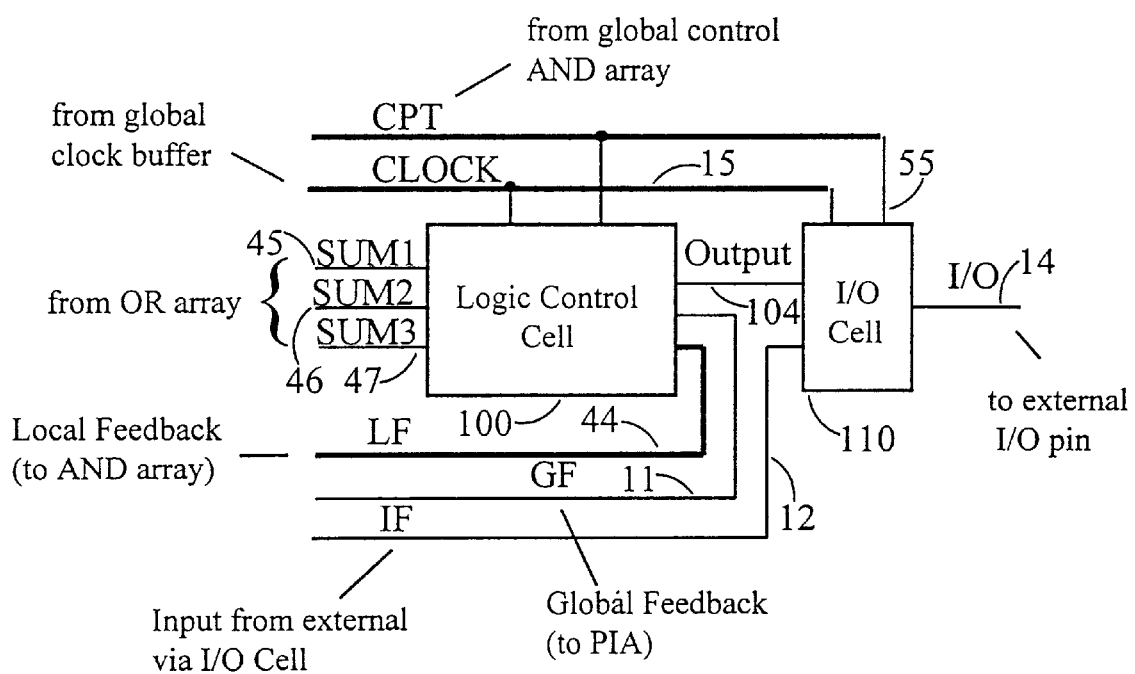
FIG. 4 is a block diagram of a Multi-Register Macro Cell (MRMC) shown in FIG. 3 and includes a logic control cell, I/O cell and all input-output connects.

FIG. 4 is a more detailed block diagram of a multi-register macro cell showing how it is constructed and how it interacts with other parts of the circuit. The multi-register macro cell is constructed by connecting a Logic Control Cell (LCC) 100 with an I/O cell 110. Three sum term logic functions are connected to the logic control cell, to provide combination logic function.

The logic control cell 100 receives sum terms sum1 45, sum2 46, sum3 47 as inputs from the OR array and generates two group of feedbacks, local feedback 44 and global feedback 11. The logic control cell also generates logic output 104, which is sent to the external through the I/O cell 110. The local feedbacks 44 are locally fed into the AND array within the same configurable logic cell, while global feedbacks 11 are globally fed into the interconnection array for global use. I/O cell 110 serves as an input/ output manager, which sends output 104 to the I/O 14, or receives an external input signal on I/O 14 as circuit input 12. This input is fed into both the local AND array and the global interconnection array. The logic control cell is user-configurable through the programmable EEPROM cells and provides a plurality of logic functions and controls the signal path.

The logic control cell 100 and the I/O cell 110 are both controlled by control product terms 55 from the control AND array and the clocks 15 from the global clock buffer. The preset, clear and clock signals of the registers in the logic control cell 100 and the I/O cell 110 can be flexibly selected from a number of signals among the control product terms 55 and clocks 15, which have different scopes of control. All these selections are made by programming the configuration memory cells according to the application.

Figure 5:
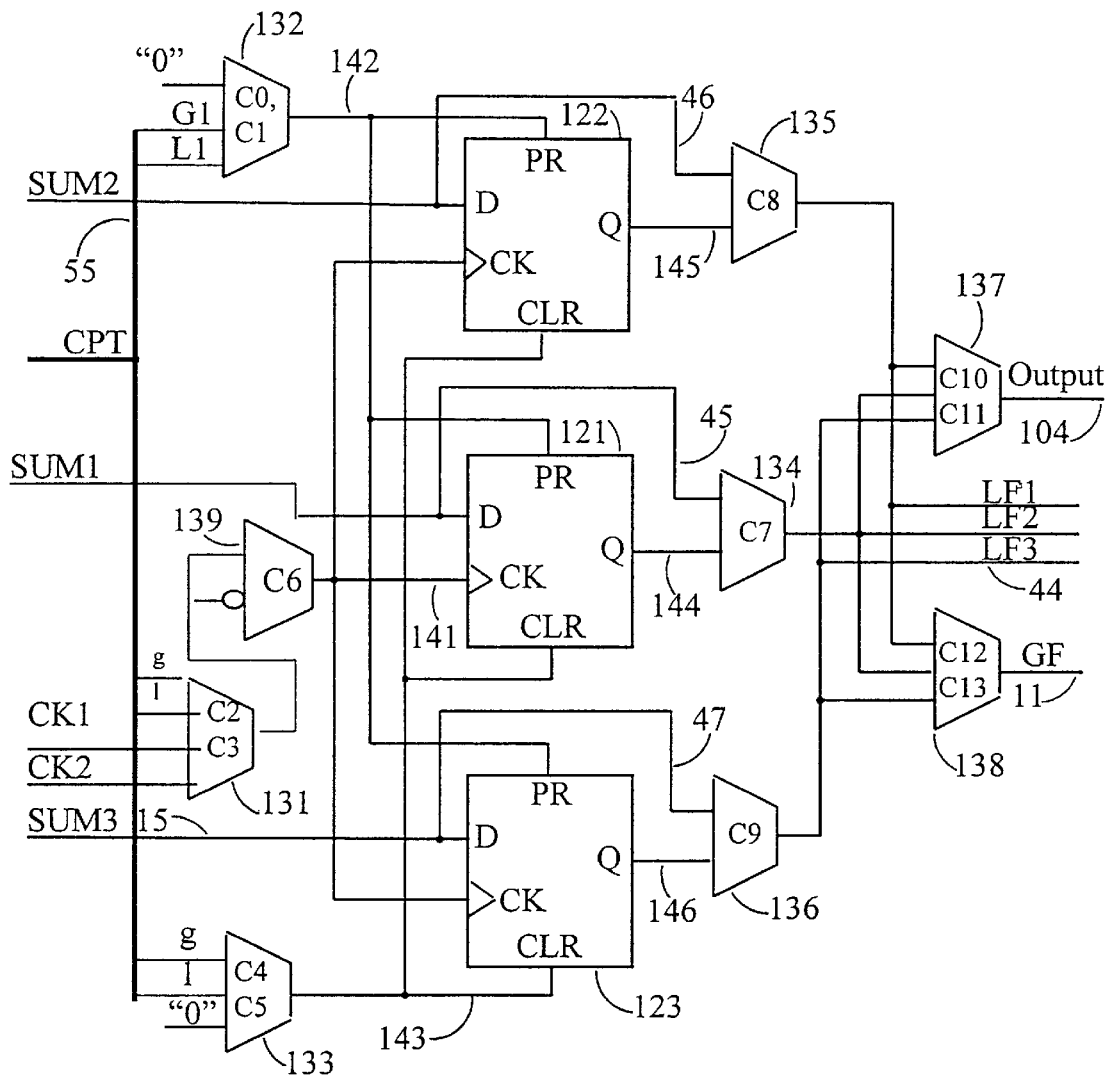
FIG. 5 is a detailed schematic block diagram showing Logic Control Cell (LCC) construction which is a major part of the MRMC in FIG. 4.

FIG. 5 is a detailed schematic diagram of the logic control cell 100 in FIG. 4. It includes of three registers 121, 122 and 123 and nine multiplexers 131–139. Registers 121–123 are D flip flops with preset and clear.

The D inputs of the registers are simply connected to sum1–3 from the OR array. In every multi-register macro cell, the control product term bus 55 from the control AND array includes six logic built-in block-wide global control signals and four local control signals. The clock of every register is connected together to net 141 which is generated by multiplexers 131 and 139. In same way, the preset and clear of every register are connected to nets 142 and 143, respectively. The clock of the registers, going through multiplexer 131, can be either a device wide global clock signal CK1/CK2 or an LBB wide global control signal or a local control signal from the control product term. Multiplexer 139 is used to select the polarity of the clock. The preset and clear of the register can be either an LBB wide global control signal or a local control signal from the control product term. The preset and clear can also be "0", which masks the preset and clear functions of the register. The logic function output signal of the logic control cell can be configured in three ways. It can go out directly to the I/O pins, it can be used as feedback to local logic circuits, or it can go as feedback to the global PIA. In the latter case the signal may go either directly to the PIA or through a register to the PIA. Multiplexers 134–136 select local feedbacks 44 from either direct outputs 45–47 of sum1–3 or the latched version of sum1–3 144–146. At same time, to minimize the global interconnection, the global feedback 11 to the programmable interconnection array is selected by multiplexer 138 from local feedbacks 44. The external output 104 is also selected by multiplexer 137 from 44. The non-selected signals can go through local feedback to extend local logic capability.

The flow of the signal through each multiplexer above is controlled by the configurable memory cells connected to it. Different combinations of the contents of these memory cells ("0" or "1") determine different logic flow and logic function. The multiplexers are configured during programming in accordance with the application.

With the above logic control cell structure, the number of registers per I/O is more than one, which increases the capability of the device. The local feedback is enhanced, while global feedback is minimized, which results in more flexible built-in blocks with less chip array and high timing performance.

Figure 6:
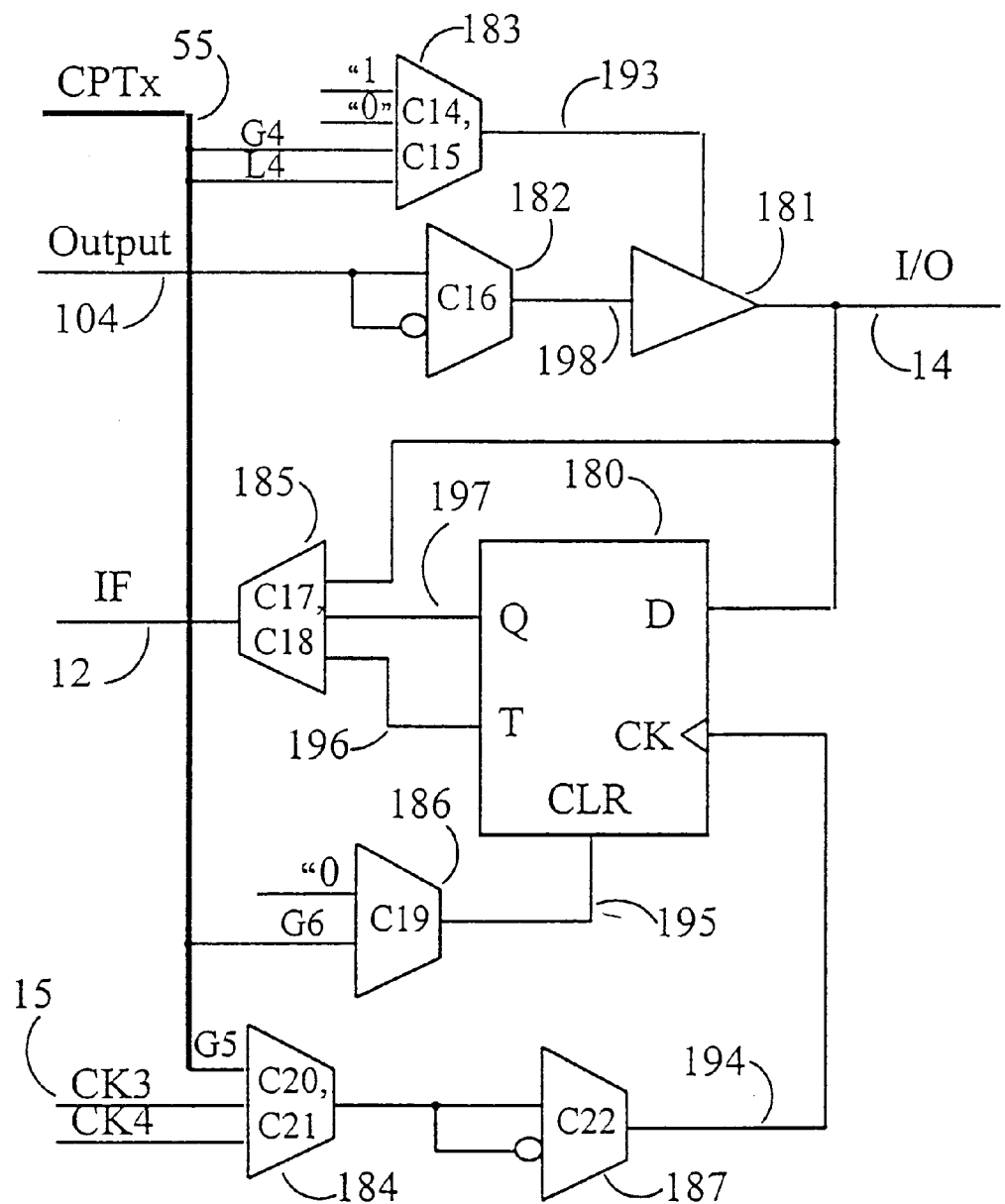
FIG. 6 is a schematic block diagram, illustrating Input/Output (I/O) cell construction which is a part of the MRMC in FIG. 4.

FIG. 6 is a detailed schematic diagram of the I/O Cell 110 in FIG. 4. It serves as an input and output manager, and includes a tri-state buffer 181, a D/L type register 180 and six multiplexers 182–187.

The multiplexer 182 is used to select the polarity of output 104, so the output of the multiplexer 198 can be either the original or an inverted version of the output. This output signal is buffered by tri-state buffer 181, whose output enable is controlled by multiplexer output 193. Control product term bus 55 contains LBB wide control signals and local control signals from the control AND array. In reference to multiplexer 183, if output enable 193 is selected to be the control signal (LBB wide or local) from the control AND array, the 181 is configured to be a tri-state output buffer or a bi-directional buffer. If output enable 193 is selected to be "0", the 181 is configured to be a transparent output buffer.

If output enable 193 is selected to be "1", the 181 is configured to be a high impedance device and the I/O cell works as an input cell.

Register 180 is a type of configurable D/L register with only one clear input. It can be configured as an edge sensitive D type flip-flop (output Q), or a level sensitive latch (output T). Its clear signal can be selected by multiplexer 186 to be one of the LBB-wide control signals from the control product term, or a "0" to mask the clear function.

As an input cell, input/feedback 12 can come from I/O 14, or from 196–197, a version of level or edge latched 14, selected by multiplexer 185. If register 180 is used as the input latch, its clock 194 can be configured to be either device-wide global clocks CK3/CK4 or to be an LBB-wide global control signal from control product terms through multiplexer 184. The polarity of input register can be selected by multiplexer 187.

In FIG. 5 and FIG. 6, control product term bus 55 in every multi-register macro cell is evaluated into global control signals G1–6 and local control signals L1–4. All these control signals to the registers in the multi-register macro cell are configurable. The configuration is determined by the user through twenty four configuration bits (C0–C23).

Besides these configuration bits, two additional bits, security bit (S0) and a power bit (P0), are used to control the read back function and power of the device. All these configuration bits are selectively connected to the multi-register macro cell components. The following table shows an example of logic value allocation of configuration bits.

Multi-register macro cell, security and power control configuration bits table:

| | | |
|---|---|---|
| C0 | C1 | PRESET SELECT |
| 0 | 0 | "0" |
| 0 | 1 | G1 |
| 1 | 0 | L1 |
| C2 | C3 | CLOCK SELECT |
| 0 | 0 | G2 |
| 0 | 1 | L2 |
| 1 | 0 | CK1 |
| 1 | 1 | CK2 |
| C6 | | CLOCK POLARITY |
| 0 | | Non-inverted |
| 1 | | Inverted |
| C4 | C5 | CLEAR SELECT |
| 0 | 0 | G3 |
| 0 | 1 | L3 |
| 1 | 0 | "0" |
| C7 | | LF SELECT 1 |
| 0 | | SUM1 |
| 1 | | Latched SUM1 |
| C8 | | LF SELECT 2 |
| 0 | | SUM2 |
| 1 | | Latched SUM2 |
| C9 | | LF SELECT 3 |
| 0 | | SUM3 |
| 1 | | Latched SUM3 |
| C10 | C11 | LCC OUTPUT SELECT |
| 0 | 0 | LF1 |
| 0 | 1 | LF2 |
| 1 | 0 | LF3 |
| C12 | C13 | GF SELECT |
| 0 | 0 | LF1 |
| 0 | 1 | LF2 |
| 1 | 0 | LF3 |
| C14 | C15 | OUTPUT ENABLE |
| 0 | 0 | "1" |
| 1 | 1 | "1" |
| 1 | 0 | G4 |
| 1 | 1 | L4 |
| C16 | | OUTPUT POLARITY |
| 0 | | Non-inverted |
| 1 | | Inverted |
| C17 | C18 | INPUT SELECT |
| 0 | 0 | Direct |
| 0 | 1 | D flip-flop (Q) |
| 1 | 0 | Latch (T) |
| C19 | | INPUT LATCH CLEAR |
| 0 | | "0" |
| 1 | | G6 |
| C20 | C21 | INPUT CLOCK |
| 0 | 0 | G5 |
| 0 | 1 | CK3 |
| 1 | 0 | CK4 |
| C22 | | INPUT CLOCK POLARITY |
| 0 | | Non-inverted |
| 1 | | Inverted |
| C23 | | INPUT REGISTER TYPE |
| 0 | | D flip-flap |
| 1 | | Latch |
| S0 | | SECURITY |
| 0 | | On |
| 1 | | Off |
| P0 | | POWER DOWN |
| 0 | | On |
| 1 | | Off |

In the above table, CK1–4 are global clocks in 15, G1–6 are LBB-wide global control product terms in 55 and L1–4 are local control product term in 55. All four multi-register macro cells in a LBB share G1–6, while every multi-register macro cell has its own L1–4.

The invention described is a specific embodiment and is merely illustrative of the principles of this invention and is not to be construed as limiting the invention. Various modifications and applications can be made by those skilled in the art without departing from the true spirit and scope of the invention.

What is claimed is:

1. A high density programmable logic device comprising a global programmable interconnection array communicating information between logic built-in blocks, a plurality of said logic built-in blocks each having inputs for receiving input signals and connecting to said programmable interconnection array, and receiving signals from other said logic built-in blocks and generating output signals to said interconnection array and communicating with other logic built in blocks, each logic built-in block including a logically connected programmable AND gate array having inputs for receiving input signals and generating a plurality of product terms, a logically connected programmable OR gate array connected to receive product terms from said AND gate array and producing sum terms, said individual sum terms from said OR gate array serving multiple functions based upon programming of a multi-register macro cell, a programmable control AND array having inputs for receiving input from said program interconnection array and from local feedback of said multi-register macro cell, and generating a plurality of universal control product terms including global control product terms and group local control product terms, a plurality of multi-register macro cells each connected to receive a plurality of said sum terms from said programmable OR gate array, each multi-register macro cell including a first programmable register means for receiving sum terms, an output control means for selecting output signal, a local feedback from said register means to said AND array, a global feedback from said register means to said programmable interconnection array, an I/O terminal means connected to receive outputs from said programmable register means, and an input feedback from said I/O terminal to said AND gate array wherein said register means and said I/O terminal means can function independently, each logic output from said multi-register macro cell can be programmably routed as feedback signals to said AND gate array or as an output to an I/O terminal.

2. The device of claim 1 further comprising second register means connected to said I/O terminal means and wherein said I/O terminal means is responsive to an output-enable control signal to function as a latched input to said AND gate array, a register input to said AND gate array, a dedicated output, and as an I/O terminal with no register or latch.

3. The device of claim 1 further comprising a global clock means buffering an external clock signal to all said register means in said multi-register macro cells.

4. The device of claim 1 wherein said plurality of multi-register macro cells in said logic built-in blocks is organized into four cell groups, each cell group responding to group control signals including group preset, group clear and group clock.

5. The device of claim 1 wherein said programmable register means is a group of D flip-flops.

6. The device of claim 1 and further comprising second register means connected to said I/O terminal means and wherein said I/O terminal means is responsive to an output-enable control signal to function as a latched input to said AND gate array, a register input to said AND gate array, a dedicated output, and as an I/O terminal without register or latch.

7. For use in a high density programmable logic device in which a programmable interconnection array connects logic blocks, a logic built-in block comprising a logically connected programmable AND gate array having inputs for receiving input signals and generating a plurality of product terms, a logically connected programmable OR gate array connected to receive product terms from said AND gate array and producing sum terms, said individual sum terms from said OR gate array serving multiple functions based upon programming of a multi-register macro cell, a programmable control AND array having inputs for receiving input from said program interconnection array and from local feedback of said multi-register macro cell, and generating a plurality of universal control product terms including global control product terms and group local control product terms, a plurality of multi-register macro cells each connected to receive a plurality of said sum terms from said programmable OR gate array, each multi-register macro cell including a first programmable register means for receiving sum terms, an output control means for selecting output signal, a local feedback from said register means to said AND array, a global feedback from said register means to said programmable interconnection array, an I/O terminal means connected to receive outputs from said programmable register means, and an input feedback from said I/O terminal to said AND gate array wherein said register means and said I/O terminal means can function independently, each logic output from said multi-register macro cell can be programmably routed as feedback signals to said AND gate array or as an output to an I/O terminal.

8. The device of claim 7 wherein each of said plurality of multi-register macro cells in said logic built-in blocks is organized into four cell groups, each cell group responding to group control signals including group preset, group clear and group clock.

9. For use in a high density programmable logic device in which a plurality of programmable gate arrays in logic built-in blocks produce sum terms, a multi-register macro cell comprising a first programmable register means for receiving sum terms, an output control means for selecting output signal, a local feedback from an register means to said AND array, a global feedback from an register means to said programmable interconnection array, an I/O terminal means connected to receive outputs from said programmable register means, and an input feedback from said I/O terminal to said AND gate array wherein said register means and said I/O terminal means can function independently, each logic output from said multi-register macro cell can be programmably routed as feedback signals to said AND gate array or as an output to an I/O terminal.

10. The device of claim 9 wherein said programmable register means is a group of D flip-flops.

11. The device of claim 9 further including means for inverting the polarity of clock and input data.

* * * * *